(12) United States Patent
Marr et al.

(10) Patent No.: US 6,410,367 B2
(45) Date of Patent: Jun. 25, 2002

(54) FUSE FOR USE IN A SEMICONDUCTOR DEVICE, AND SEMICONDUCTOR DEVICES INCLUDING THE FUSE

(75) Inventors: Kenneth W. Marr; Michael P. Violette, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/759,852

(22) Filed: Jan. 12, 2001

Related U.S. Application Data

(62) Division of application No. 09/293,192, filed on Apr. 16, 1999.

(51) Int. Cl.[7] .............................................. H01L 21/82
(52) U.S. Cl. ..................... 438/132; 438/215; 438/281; 438/333; 438/467; 438/601
(58) Field of Search ................................ 438/132, 215, 438/281, 333, 467, 601; 257/529, 209

(56) References Cited

U.S. PATENT DOCUMENTS

| | | | |
|---|---|---|---|
| 3,564,354 A | 2/1971 | Aoki et al. |
| 3,641,516 A | 2/1972 | Castrucci et al. |
| 3,707,767 A | 1/1973 | Quevrin |
| 3,783,506 A | 1/1974 | Rehfeld |
| 3,930,304 A | 1/1976 | Keller et al. |
| 4,042,950 A | 8/1977 | Price |
| 4,135,295 A | 1/1979 | Price |
| 4,267,633 A | 5/1981 | Seiler |
| 4,424,578 A | 1/1984 | Miyamoto |
| 4,428,066 A | 1/1984 | Kihara et al. |
| 4,494,135 A | 1/1985 | Moussie |
| 4,647,340 A | 3/1987 | Szluk |
| 4,670,970 A | 6/1987 | Bajor |
| 4,679,310 A | 7/1987 | Ramachandra et al. |
| 4,740,485 A | 4/1988 | Sharpe-Geisler |
| 4,796,075 A | 1/1989 | Whitten |
| 4,835,118 A | 5/1989 | Jones, Jr. et al. |
| 4,935,801 A | 6/1990 | McClure et al. |
| 5,231,056 A | 7/1993 | Sandhu |
| 5,240,739 A | 8/1993 | Doan et al. |
| 5,264,725 A | 11/1993 | Mullarkey et al. |
| 5,278,100 A | 1/1994 | Doan et al. |
| 5,376,405 A | 12/1994 | Doan et al. |
| 5,578,517 A | 11/1996 | Yoo et al. |
| 5,618,750 A | 4/1997 | Fukuhara et al. |
| 5,652,175 A | 7/1997 | Chen et al. |

(List continued on next page.)

FOREIGN PATENT DOCUMENTS

JP 4-162471 * 6/1992 ................. 257/529

OTHER PUBLICATIONS

Gail Robinson, PROM Fuse Design Scales to Sub–0.25 Micron, Sep. 29, 1997, Electronic Engineering Times, p. 44.

Primary Examiner—John F. Niebling
Assistant Examiner—Jennifer M. Kennedy
(74) Attorney, Agent, or Firm—TraskBritt

(57) ABSTRACT

A metal silicide fuse for a semiconductor device. The fuse includes a conductive region positioned adjacent a common well of a first conductivity type, a terminal region positioned adjacent a well of a second conductivity type, and a narrowed region located between the terminal region and the conductive region and positioned adjacent a boundary between the two wells. Upon applying at least a programming current to the fuse, the fuse "blows" at the narrowed region. The diodes between wells of different conductivity types wells and the Schottky diode or diodes between the remaining portions of the fuse and wells adjacent thereto control the flow of current through the remainder of the fuse and through the associated wells of the semiconductor device. When the fuse has been "blown," the diodes and Schottky diodes prevent current of a normal operating voltage from flowing through the wells of the semiconductor device.

33 Claims, 10 Drawing Sheets

U.S. PATENT DOCUMENTS

| | | |
|---|---|---|
| 5,661,323 A | 8/1997 | Choi et al. |
| 5,672,905 A | 9/1997 | Lee et al. |
| 5,969,403 A | 10/1999 | Fournel et al. |
| 5,969,404 A | 10/1999 | Bohr et al. |
| 6,033,939 A | 3/2000 | Agarwala et al. |
| 6,198,152 B1 * | 3/2001 | Arai ............................ 257/529 |
| 6,252,291 B1 * | 6/2001 | Woods et al. ................ 257/529 |
| 6,252,293 B1 * | 6/2001 | Seyyedy et al. ............ 257/530 |

* cited by examiner

FUSE FOR USE IN A SEMICONDUCTOR DEVICE, AND SEMICONDUCTOR DEVICES INCLUDING THE FUSE

CROSS-REFERENCE TO RELATED APPLICATION

This application is a divisional of application Ser. No. 09/293,192, filed Apr. 16, 1999, pending.

BACKGROUND OF THE INVENTION

1. Field of the Invention

The present invention generally relates to the design and fabrication of semiconductor devices. Specifically, the present invention relates to a fuse for use in a semiconductor device, to methods of fabricating the fuse, and to a semiconductor device that includes the fuse. In particular, the present invention relates to a silicide fuse of a semiconductor device and to a semiconductor memory device that includes the silicide fuse. More particularly, the present invention relates to a semiconductor device that includes two diffusion regions disposed substantially within a well of opposite conductivity type, each of which communicates with an end of a metal silicide fuse.

2. Background of Related Art

Computers typically include devices that store data, such as memory devices. A first type of memory device is referred to as a read only memory ("ROM") device, in which data is permanently stored and cannot be overwritten or otherwise altered. Thus, ROM devices are useful whenever unalterable data or instructions are required. ROM devices are also nonvolatile devices, meaning that the data is not destroyed when power to these devices is shut off. ROM devices are typically programmed during their fabrication by making permanent electrical connections in selected portions of the memory device. One disadvantage of ROM devices is that their programming is permanently determined during fabrication and cannot, therefore, be changed. Thus, when new programming is desired, a ROM device must be newly configured to be wired in accordance with the desired program.

Another type of memory device is a programmable read only memory ("PROM") device. Unlike ROM devices, PROM devices may be programmed after their fabrication. To render PROM devices programmable, some PROM devices are provided with an electrical connection in the form of a fusible link, which is also typically referred to as a fuse. A considerable number of fuse designs are known and employed in PROM devices. Exemplary fuse designs are disclosed in PROM Fuse Design Scales to Sub-0.25 Micron, Electronic Engineering Times, Sep. 29, 1997, p.4, in IEEE Transactions on Electron Devices, Vol. 33, No. 2, p.250–253 (February 1986), and in U.S. Pat. Nos. 5,672,905, 4,679,310, 5,264,725, 4,935,801, 4,670,970, 4,135,295, and 4,647,340.

An exemplary use of fuses in semiconductor devices has been in redundancy technology. Redundancy technology improves the fabrication yield of high-density semiconductor devices, such as static random access memory ("SRAM") devices and dynamic random access memory ("DRAM") devices, by facilitating the substitution of a redundant program circuit for a failed program circuit that could otherwise render the semiconductor device useless. The failed circuit may be bypassed and the redundant circuit activated or programmed by selectively programming, or "blowing," fuses of the semiconductor device.

Fuses are perhaps the simplest and most compact means of programming a semiconductor memory device with a particular wiring scheme. Perhaps the most common fuse design is a conductive layer, typically comprising metal or polysilicon, which is narrowed or "necked down" in one region. To blow the fuse, a relatively high electrical current, or programming current, is applied to the fuse. The programming current heats the metal or polysilicon of the fuse to a temperature above the melting point of the metal or polysilicon. As the fuse melts, the metal or polysilicon of the fuse "blows" or becomes discontinuous, breaking the conductive link across the fuse. Typically, the fuse becomes discontinuous at the narrowed region since the material volume at the narrowed region is smaller than that of other portions of the fuse and, consequently, the current density is highest and the temperature increases most quickly at the narrowed region of the fuse. By selectively "blowing" the fuses of a PROM device, the PROM device is programmed to have a desired wiring scheme with conductive and substantially nonconductive fuses, thereby imparting each location of the PROM with a corresponding value of "1" or "0" representative of the conductivity state of the fuse (i.e., either conductive or substantially nonconductive), an array of which values comprises the data stored in the semiconductor device.

As an alternative to employing an electrical current to program a semiconductor device, a laser may be employed to blow selected fuses. The use of lasers to "blow" fuses has, however, become increasingly difficult as the size of the features of semiconductor devices, including the fuses thereof, decreases and as the density of features of semiconductor devices increases. Since the diameter of a laser beam should be smaller than the fuse pitch, the utility of laser beams to "blow" fuses begins to diminish with fuse pitches that are about the same or less than the diameters of conventional (e.g., about 5 microns) and state of the art laser beams.

As the programming current or laser beam intensity required to "blow" a conventional fuse may damage regions or structures of the semiconductor device proximate the fuse, conventional fuses are somewhat undesirable. Moreover, if the use of laser beams is desired to program the fuses of a semiconductor device, the fuse pitch and, thus, the density of structures on the semiconductor device may be limited.

When a metal fuse is disposed adjacent a doped silicon or doped polysilicon structure to bridge selected regions thereof, the resistance of the adjacent silicon or polysilicon may not differ significantly from the resistance of the fuse. Thus, upon "blowing" the fuse, the adjacent silicon or polysilicon may continue to transmit current similar to the current carried across an intact fuse. This is especially problematic when such a fuse is disposed adjacent a region, such as an n-well, of a semiconductor substrate conductively doped to have a first conductivity type to bridge two separate conductive wells, such as p-wells, of a second conductivity type, opposite the first conductivity type, disposed adjacent the region of first conductivity type. If the fuse "blows" in a manner that leaves a section of a second, or outlet, side of the fuse that overlaps both a p-well and a portion of the common n-well, current may continue to pass into a p-well from a first side of the "blown" fuse, into the n-well, and out of the n-well to the portion of the second side of the "blown" fuse that overlaps the n-well. Thus, a fuse that blows in such a manner may undesirably conduct current having substantially the same characteristics as current conducted across an intact fuse.

Moreover, since electrically conductive metal silicide structures may be fabricated by annealing metal to an adjacent silicon or polysilicon structure, metal fuses that are disposed adjacent to silicon or polysilicon structures may conduct current even after being "blown." This may occur if a high enough current is applied to the fuse or if the fuse is otherwise heated to a sufficient temperature to cause the metal of the fuse to anneal to the adjacent semiconductive material and to thereby form a metal silicide that may bridge the discontinuous portion of the fuse. The "blown" fuse may thus undesirably conduct current having substantially the same characteristics as current conducted across an intact fuse.

Accordingly, there is a need for a fuse that may be fabricated adjacent a semiconductive region of a state of the art semiconductor device and that, upon programming, or "blowing," the fuse has a significantly different resistance than the previously intact fuse. There is also a need for a fuse that can be fabricated by known semiconductor device fabrication techniques.

BRIEF SUMMARY OF THE INVENTION

The present invention generally provides a fuse for integrated circuits and semiconductors. The fuse of the present invention comprises a metal silicide layer with at least one terminal end thereof contacting an area of a semiconductor substrate that has been implanted with a dopant of a second conductivity type. A conductive region of the fuse, which is disposed adjacent the at least one terminal end, contacts another area of the semiconductor substrate that has been implanted with a dopant of a first conductivity type. The at least one terminal end and the conductive region of an intact fuse according to the present invention are joined by a narrowed region disposed over a boundary between the areas of first and second conductivity types. When sufficient current flows through the fuse, the metal silicide layer melts, agglomerates, or "balls up," or otherwise ceases to conduct electrical current along the substantial length thereof, which results in an open circuit. This agglomeration preferably occurs at the narrowed region of the fuse.

Another embodiment of the semiconductor device and the fuse thereof includes a semiconductor substrate with two separate wells of a second conductivity type, preferably p-type, disposed in the semiconductor substrate, a common well of a first conductivity type, preferably an n-type conductivity, adjacent and disposed between the two separate wells, and a substantially flat metal silicide structure disposed adjacent the semiconductor substrate, with terminal ends of the metal silicide structure in communication with the two separate wells and a central, or conductive, region of the metal silicide structure disposed adjacent the common well. The semiconductor substrate may comprise p-type silicon. The common well is preferably a lightly doped region of the semiconductor substrate. The two separate wells comprise semiconductor material of a second conductivity type, which is opposite the first conductivity type, and are located within the common well and adjacent a surface of the substrate. The two separate wells are preferably highly doped.

The metal silicide of the fuse may comprise titanium silicide, tantalum silicide, tungsten silicide, molybdenum silicide, cobalt silicide, lead silicide, nickel silicide, platinum silicide, or any other metal silicide. Preferably, the metal silicide of the fuse comprises a refractory metal silicide. The metal silicide layer may include a necked-down region, or narrowed region, which is preferably narrower in width and has a smaller volume of conductive material than the terminal ends of the fuse, located between a terminal end through which current exits the fuse and the central region of the fuse.

Preferably, the narrowed region is disposed adjacent the interface between a second well of the two separate wells and the common well. Accordingly, as a programming current is applied to the fuse, the fuse will preferably become discontinuous adjacent the interface between the second well and the common well. Thus, a first remaining portion of the fuse will lie adjacent a first well of the two separate wells and the region of the n-well adjacent thereto, while a second portion of the discontinuous fuse will lie adjacent only the second well of the two separate wells. After the fuse has been blown, as current is applied to the fuse, the current will pass into the first of the two separate wells and, thus, into the common well through the first portion of the "blown" fuse. A diode, which exists at the interface between the second well of the two separate wells and the common well, which interface is also referred to as a p-n junction, as a depletion zone, as a boundary, or as a border, prevents electrical current from entering the second of the two separate wells through the common well. Accordingly, as the fuse is open, "blown," or otherwise becomes discontinuous at the narrowed region thereof, the fuse will no longer conduct a significant amount of current and, therefore, an open circuit is created.

Since the fuse material comprises metal silicide, the fuse of the present invention inhibits reconnection of the fuse by growth of a metal silicide layer and, therefore, re-closing of the circuit is prevented.

The present invention also includes a method of fabricating a fuse and a semiconductor device according to the present invention. Preferably, the fuse is fabricated on a semiconductor substrate that includes two separate wells of a second conductivity type disposed within a lightly doped region, or common well, of a first, opposite conductivity type. A metal silicide structure may be fabricated on the substrate such that terminal ends of the fuse communicate with the two separate wells and a central portion of the metal silicide structure is adjacent the common well.

The semiconductor substrate may be a p-type silicon wafer. Accordingly, the method may include lightly doping a desired diffusion region of the substrate to impart the desired location of the common well with a first conductivity type (e.g., n-type) that is opposite the light, p-type conductivity of the semiconductor substrate. The lightly doped common well may be formed by implanting ions of the first conductivity type to a first concentration into selected portions of the semiconductor substrate. The desired locations of the two separate wells that are to be disposed adjacent or within the lightly doped common well may be doped to have an opposite conductivity type (e.g., p-type) than the common well. The two separate wells may be highly doped and may be formed by implanting ions of the opposite conductivity type to a second concentration, which is preferably higher than the first concentration.

The metal silicide structure may be fabricated by disposing a layer of metal, such as titanium, tantalum, tungsten, molybdenum, cobalt, lead, or platinum adjacent at least the common well and the two separate wells of the semiconductor substrate. A layer of silicon may also be disposed adjacent the layer of metal, if necessary, to fabricate a metal silicide structure of the desired configurations and dimensions. The layer of metal and the layer of silicon, if any, may be patterned to substantially the desired configuration of the metal silicide fuse. Preferably, the metal and silicon layers are patterned to define a fuse structure including a narrow, elongated conductive region, a narrowed region adjacent an end of the conductive region, and at least one terminal end that is wider than the narrowed region and disposed adjacent the narrowed region, opposite the conductive region. Alternatively, the fuse may be defined after a metal silicide layer has been formed. The layer of metal may be heated to anneal or otherwise react the metal with the silicon of either the substrate or an adjacent layer of silicon to form the metal silicide structure. Alternatively, a layer of metal silicide may be disposed adjacent the semiconductor substrate by other known processes, such as by chemical vapor deposition ("CVD") techniques, then patterned to define the fuse.

Other features and advantages of the present invention will become apparent to those of ordinary skill in the art through a consideration of the ensuing description, the accompanying drawings, and the appended claims.

BRIEF DESCRIPTION OF THE SEVERAL VIEWS OF THE DRAWINGS

The figures presented in conjunction with this description are not actual views of any particular portion of an actual semiconductor device or component, but are merely representations employed to clearly and fully depict the present invention.

DETAILED DESCRIPTION OF THE INVENTION

The following description provides specific details about the fuse and methods of the present invention in order to provide a thorough understanding of the present invention. The skilled artisan, however, would understand that the present invention may be practiced without employing these specific details. Indeed, the present invention can be practiced in conjunction with other materials, differently configured structures, and other fabrication techniques, such as those known in the industry.

The process steps and structures described herein do not form a complete process flow for fabricating semiconductor devices or a completed device. Only the process steps and structures necessary to understand the present invention are described.

Figure 1:
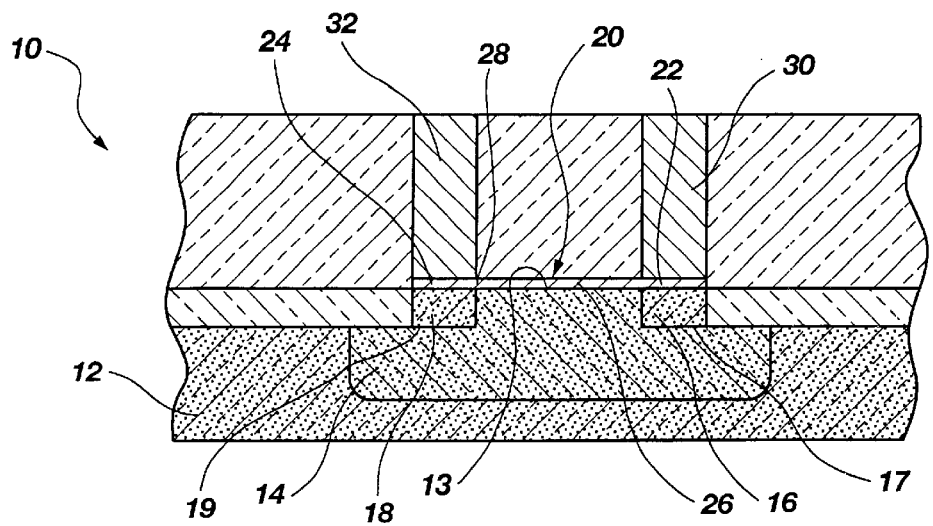
FIG. 1 is a cross-sectional representation of a semiconductor device including a fuse according to the present invention, which fuse includes a central, or conductive, region disposed adjacent and in communication with an n-well of the semiconductor substrate and end, or terminal, regions that are continuous with the conductive region, each terminal regions of which is disposed adjacent and in communication with a p-well disposed within or adjacent to the n-well.
Figure 1A:
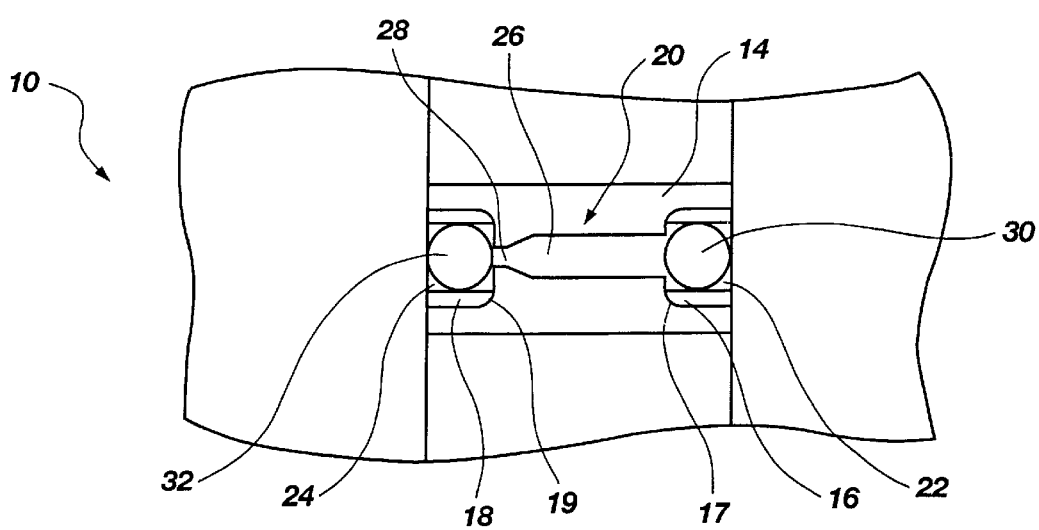
FIG. 1A is a schematic representation of a top view of the semiconductor device, including the fuse thereof, of FIG. 1.

With reference to FIGS. 1 and 1A, a semiconductor device 10 including a fuse 20 according to the present invention is illustrated. Semiconductor device 10 includes a semiconductor substrate 12 within which a common well 14 of a first conductivity type is disposed. At least two separate wells 16 and 18 of a second conductivity type, which is preferably opposite the first conductivity type of common well 14, are disposed within or adjacent common well 14.

Fuse 20, which is disposed adjacent semiconductor substrate 12, includes terminal regions or ends 22 and 24, which are also referred to herein as second regions, that are disposed adjacent wells 16 and 18, respectively. A conductive central region 26, which is also referred to herein as a central region or as a first region, of fuse 20 is disposed between terminal ends 22 and 24 and facilitates communication between terminal ends 22 and 24. Central region 26 is disposed adjacent common well 14. A narrowed region 28, or necked-down region, of fuse 20 may be disposed between conductive region 26 and terminal end 24, adjacent the boundary, border, or interface between well 18 and common well 14. Narrowed region 28 preferably has a smaller volume of conductive material than terminal ends 22 and 24 and than central region 26. Semiconductor device 10 may also include at least two contacts 30 and 32 disposed in communication with terminal ends 22 and 24, respectively.

Semiconductor substrate 12, which is preferably a p-type substrate, may comprise a semiconductor wafer, such as a silicon wafer, or a silicon layer of a silicon on insulator ("SOI") structure, such as a silicon on glass ("SOG") structure, a silicon on ceramic ("SOC") structure, or a silicon on sapphire ("SOS") structure.

Common well 14 preferably comprises an n-well. Thus, the first conductivity type of common well 14 is an n-type conductivity. As illustrated, common well 14 is disposed adjacent a surface 13 of semiconductor substrate 12.

Wells 16 and 18 are also disposed adjacent surface 13. Wells 16 and 18 may be disposed within common well 14 or adjacent thereto. As wells 16 and 18 comprise semiconductor material doped with a second conductivity type, which is preferably opposite the first conductivity type, wells 16 and 18 are preferably p-wells and, therefore, have a p-type conductivity.

Fuse 20 comprises metal silicide. Exemplary metal silicides that may be employed in fuse 20 include, without limitation, titanium silicide, tantalum silicide, tungsten silicide, molybdenum silicide, cobalt silicide, lead silicide, and platinum silicide. Preferably, upon the application of a programming current, the metal silicide of fuse 20 agglomerates, or "balls up," and thereby becomes discontinuous. Such agglomeration of the metal silicide of fuse 20 may prevent damage to regions of semiconductor device 10 or structures thereof that are proximate fuse 20 as fuse 20 is programmed.

With continued reference to FIG. 1, as wells 16 and 18 preferably include a high concentration of semiconductor material having a p-type conductivity and common well 14 preferably includes semiconductor material lightly doped to have an n-type conductivity, the p-n junctions or depletion zones 17 and 19 between well 16 and common well 14 and between well 18 and common well 14, respectively, comprise diodes 17' and 19' (FIG. 1B) that prevent current from flowing into wells 16 and 18 from common well 14. The interface between central region 26 of fuse 20 and common well 14 comprises a so-called Schottky diode 15'. As is known in the art, however, at a certain voltage, such as the normal operating voltage of semiconductor device 10, Schottky diode 15' may become reverse-biased. If Schottky diode 15' becomes reverse-biased, current will flow from common well 14 into central region 26 of fuse 20.

Figure 1B:
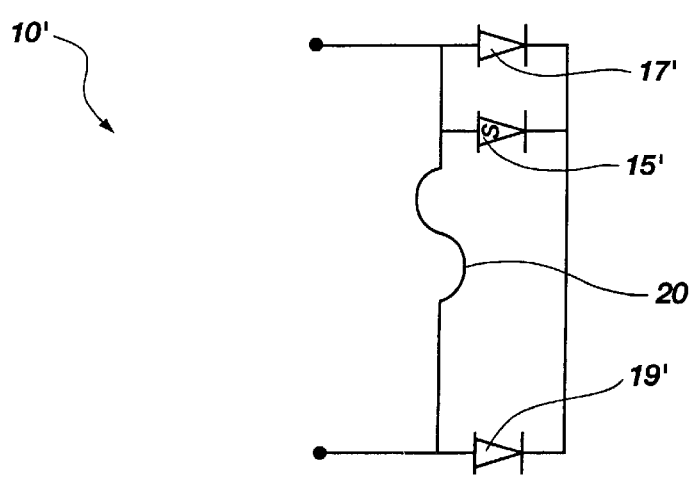
FIG. 1B is a schematic representation of a circuit including the semiconductor device and the fuse thereof of FIG. 1.

FIG. 1B is a schematic representation of a circuit 10' of semiconductor device 10, which illustrates fuse 20, diodes 17' and 19', and Schottky diode 15'. As fuse 20 is intact, current flows from terminal region 22, through conductive region 26, to terminal region 24 (see FIG. 1).

Figure 4:
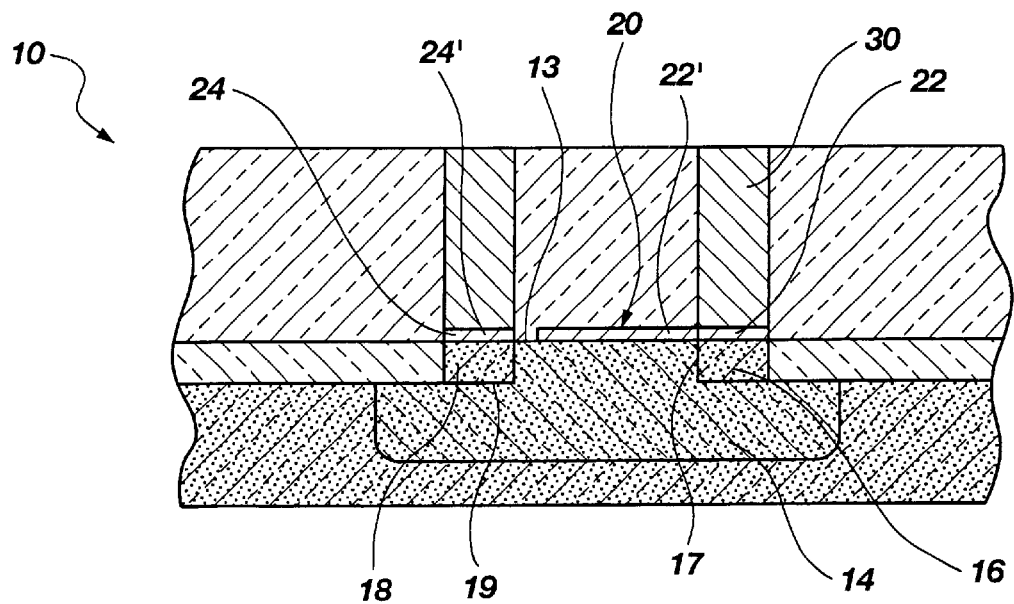
FIG. 4 is a cross-sectional representation of a "blown" fuse according to the present invention and, in particular, the fuse illustrated in FIG. 1.
Figure 4A:
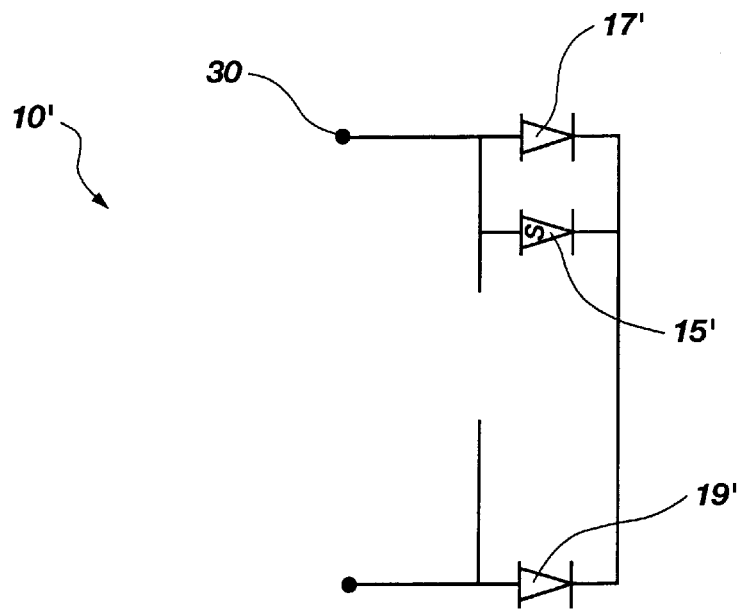
FIG. 4A is a schematic representation of a circuit of the "blown" fuse of FIG. 4.

Upon application of a programming current to fuse 20, as illustrated in FIG. 4, fuse 20 is preferably rendered discontinuous adjacent the interface between common well 14 and well 18 at surface 13, which interface is also referred to herein as a boundary or border. Accordingly, terminal region 24 of fuse 20, which comprises a second portion 24' of the "blown" fuse 20, does not overlap common well 14. Thus, second portion 24' of fuse 20 is not part of a Schottky diode. FIG. 4A is a schematic representation of the open circuit 10' of semiconductor device 10 that is created as fuse 20 is "blown."

With continued reference to FIGS. 4 and 4A, as a current is applied to contact 30, the current is conducted into common well 14 through well 16 and, therefore, through diode 17'. As diode 19', located at the p-n junction 19 between common well 14 and well 18, prevents current from flowing from common well 14 into well 18 and since no Schottky diode exists between common well 14 and second portion 24' of fuse 20, the current, at a normal operating voltage of semiconductor device 10, will not flow into the outlet terminal region 24 of fuse 20. Thus, an open circuit has been created which conducts substantially no current.

Figure 5:
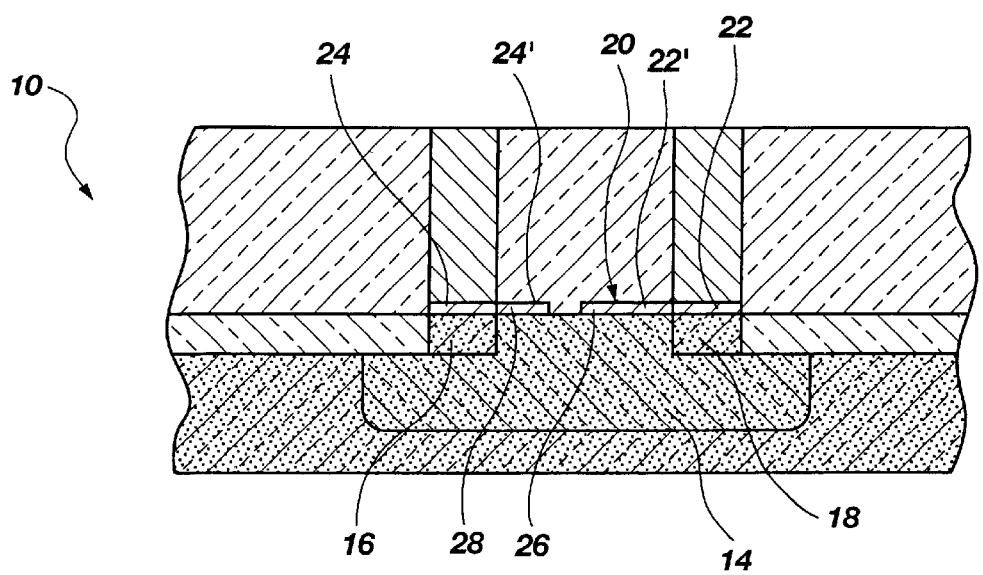
FIG. 5 is a cross-sectional representation of a semiconductor device including the fuse of the present invention, such as the fuse illustrated in FIG. 1, that has been undesirably resistively "blown" and, therefore, will continue to conduct current.
Figure 5A:
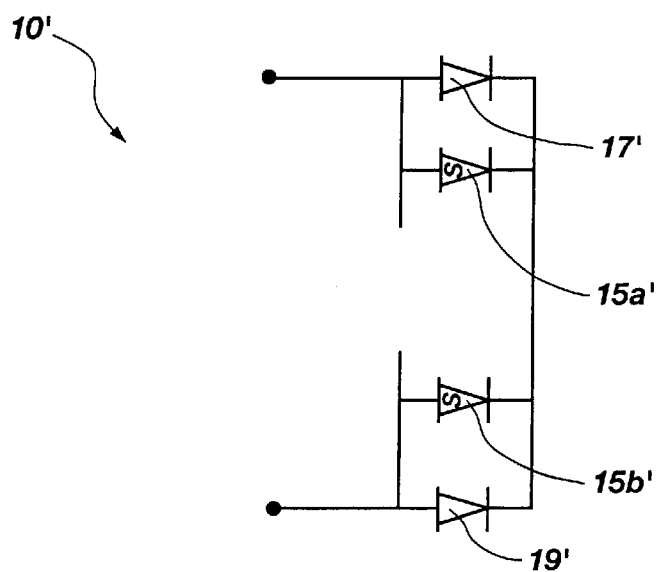
FIG. 5A is a schematic representation of a circuit including the resistively "blown" fuse illustrated in FIG. 5.

Turning to FIGS. 5 and 5A, if fuse 20 is blown such that both a first portion 22' thereof, which is in communication with well 18, and a second portion 24' thereof, which is in communication with well 16, both include regions that partially overlap common well 14, Schottky diodes 15a' and 15b' will result at the interfaces between first portion 22' and common well 14 and between second portion 24' and common well 14. Fuse 20 may "blow" in this manner when too high a programming current is applied thereto or if the volume of conductive material of narrowed region 28 of central region 26 is not sufficiently less than the volumes of conductive material of both central region 26 and terminal region 24. As Schottky diodes 15a' and 15b' exist where first portion 22' and second portion 24', respectively, of fuse 20 contact common well 14, the voltage across Schottky diode 15b' may be sufficient to reverse-bias Schottky diode 15b' during normal operation of semiconductor device 10. If Schottky diode 15b' becomes reverse-biased, Schottky diode 15b' will "leak" current to terminal region 24. Thus, although fuse 20 has been "blown," circuit 10' of semiconductor device 10 may continue to conduct current. The voltage at which Schottky diode 15b' becomes reverse-biased depends upon the dopant and the dopant concentration employed to form common well 14.

Figure 2:
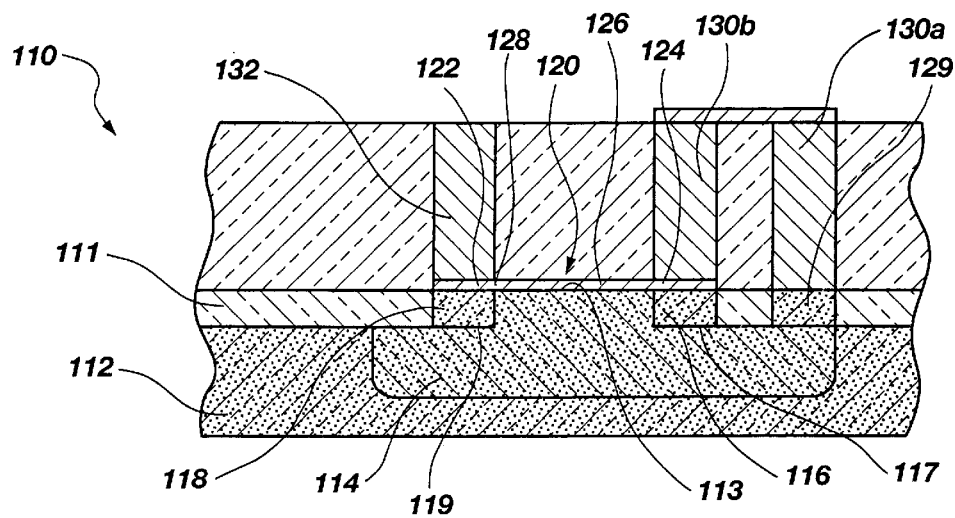
FIG. 2 is a cross-sectional representation of a semiconductor device including another embodiment of the fuse of the present invention.

Referring to FIG. 2, an alternative embodiment of a semiconductor device 110, including a fuse 120 according to the present invention, is illustrated. Semiconductor device 110 includes a semiconductor substrate 112 with a common well 114 disposed adjacent a surface 113 thereof. At least two separate, spaced-apart wells 116 and 118 are disposed adjacent surface 113 and within or adjacent common well 114. A portion of surface 113 of semiconductor substrate 112 that includes wells 116 and 118 and the portion of common well 114 disposed between wells 116 and 118 is exposed through a field oxide 111 layer of semiconductor device 110. An ohmic contact 129 is also exposed through field oxide 111 and is disposed in contact with common well 114.

A fuse 120 is disposed adjacent semiconductor substrate 112 and includes at least two terminal regions 122 and 124, which are also referred to herein as second regions, which communicate with wells 116 and 118, respectively, and a central region 126, which is also referred to herein as a conductive region or as a first region. Central region 126 is disposed between terminal regions 122 and 124 and adjacent the portion of common well 114 disposed between wells 116 and 118. A narrowed region 128 of fuse 120 is disposed between central region 126 and terminal region 124, the outlet terminal of fuse 120. Narrowed region 128 is also disposed adjacent the interface between common well 114 and well 118 at surface 113. Narrowed region 128 preferably has a smaller volume of conductive material than terminal regions 122 and 124 and than central region 126.

Contacts 130a, 130b, and 132 may be disposed in communication with ohmic contact 129, well 116, and well 118, respectively. Contacts 130a and 130b preferably both communicate with a current source. Terminal region 122 of fuse 120 communicates with contact 130b. Terminal region 124 of fuse 120 communicates with contact 132.

Semiconductor substrate 112 may comprise a semiconductor wafer or a layer of semiconductor material disposed on an insulator, such as a SOG structure, a SOC structure, a SOS structure, or another SOI structure. Semiconductor substrate 112 has preferably been lightly doped with a p-type dopant and, therefore, has a p-type conductivity.

Common well 114 has a first conductivity type, while wells 116 and 118 have a second conductivity type, which is opposite the first conductivity type. Preferably, common well 114 has an n-type conductivity and is, therefore, an n-well. The second conductivity type of wells 116 and 118 is preferably a p-type conductivity. Thus, wells 116 and 118 are preferably p-wells. The dopant concentration of wells 116 and 118 is preferably greater than the dopant concentration of common well 114. Thus, common well 114 may be lightly doped, while wells 116 and 118 may be heavily doped. Ohmic contact 129 preferably comprises a well of semiconductor material having a greater concentration of the first conductivity type than common well 114.

Fuse 120 comprises metal silicide. Exemplary metal silicides that may be employed in fuse 120 include, without limitation, titanium silicide, tantalum silicide, tungsten silicide, molybdenum silicide, cobalt silicide, lead silicide, and platinum silicide. Preferably, upon the application of a programming current, the metal silicide of fuse 120 agglomerates, or "balls up," and thereby becomes discontinuous. Such agglomeration of the metal silicide of fuse 120 may prevent damage to regions of semiconductor device 110 or structures thereof that are proximate fuse 120 as fuse 120 is programmed.

Referring again to FIG. 1B, as with the previously described embodiment, semiconductor device 110 includes diodes 17' and 19' at the p-n junctions 117 and 119 between well 116 and common well 114 and between well 118 and common well 114, respectively. As wells 116 and 118 each preferably comprise a p-type semiconductor material and common well 114 preferably comprises an n-type semiconductor material, diodes 17' and 19' prevent current from traveling into wells 116 and 118 from common well 114. A Schottky diode 15' exists between central region 126 of fuse 120 and the adjacent common well 114. Schottky diode 15', while forward-biased, prevents current from traveling from common well 114 into central region 126 of fuse 120. As is known in the art, however, at a certain voltage, such as the normal operating voltage of semiconductor device 110, Schottky diode 15' may become reverse-biased. If Schottky diode 15' becomes reverse-biased, current will flow from common well 114 into central region 126 of fuse 120. The circuit of semiconductor device 110 is similar to that illustrated in FIG. 1B.

Figure 3:
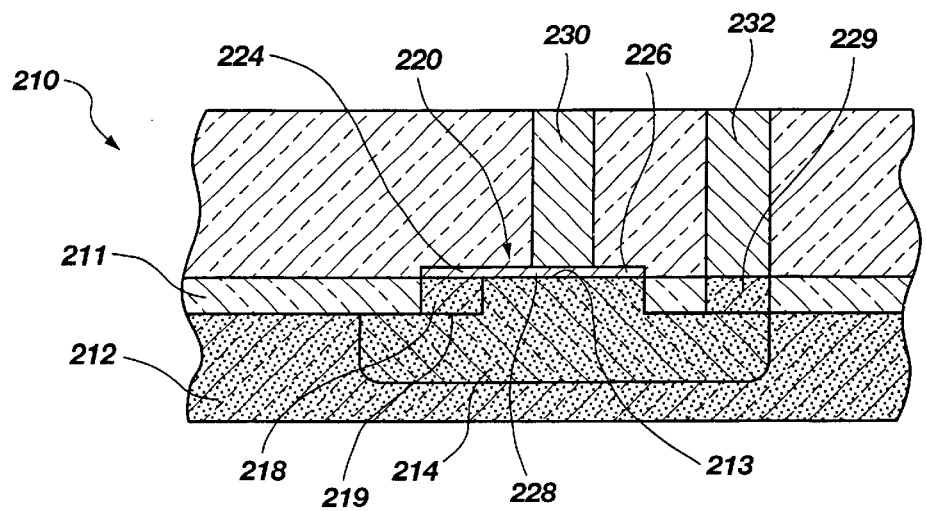
FIG. 3 is a cross-sectional representation of a semiconductor device including yet another embodiment of the fuse of the present invention.

FIG. 3 illustrates another embodiment of a semiconductor device 210, which includes a fuse 220 according to the present invention. Semiconductor device 210 includes a semiconductor substrate 212 with a field oxide layer 211 disposed thereon. A region of semiconductor substrate 212, which is exposed through field oxide 211, includes a common well 214 of a first conductivity type and another well 218 of a second conductivity type, which is opposite the first conductivity type. Well 218 is disposed within or adjacent common well 214. Both well 218 and a portion of common well 214 are disposed adjacent a surface 213 of semiconductor substrate 212 and exposed through field oxide 211. Another well of a first conductivity type, which comprises an ohmic contact 229, is disposed within or adjacent common well 214, adjacent surface 213, and is exposed through field oxide 211. Fuse 220 is disposed adjacent at least common well 214 and well 218. A terminal region 224, which is also referred to herein as a second region, of fuse 220 is disposed adjacent well 218, while a conductive region 226, which is also referred to herein as a first region, of fuse 220 may be disposed in communication with the portion of common well 214 disposed adjacent well 218. Conductive region 226 and terminal region 224 communicate with a narrowed region 228 of fuse 220 disposed therebetween and adjacent the interface between common well 214 and well 218 at surface 213. Narrowed region 228 preferably has a smaller volume of conductive material than either conductive region 226 or terminal region 224.

Preferably, semiconductor substrate 212 comprises a wafer of semiconductor material or a layer of semiconductor material disposed on an insulator structure, such as a SOG structure, a SOC structure, a SOS structure, or another SOI structure. Semiconductor substrate 212 is preferably lightly doped to have a p-type conductivity.

The first conductivity type of common well 214 is preferably an n-type conductivity. Thus, common well 214 is preferably an n-well. Since well 218 comprises a semiconductor material having a second conductivity type, well 218 preferably comprises semiconductor material having a p-type conductivity. The concentration of p-type dopant in the semiconductor material of well 218 preferably exceeds the concentration of n-type dopant in the semiconductor material of common well 214. Accordingly, a diode 219' exists at the p-n junction 219 between well 218 and common well 214. Due to the respective conductivity types of common well 214 and well 218, diode 219' restricts electrical current from flowing from common well 214 into well 218.

Fuse 220 comprises metal silicide. Exemplary metal silicides that may be employed in fuse 220 include, without limitation, titanium silicide, tantalum silicide, tungsten silicide, molybdenum silicide, cobalt silicide, lead silicide, and platinum silicide. Preferably, upon the application of a programming current, the metal silicide of fuse 220 agglomerates, or "balls up," and thereby becomes discontinuous. Such agglomeration of the metal silicide of fuse 220 may prevent damage to regions of semiconductor device 210 or structures thereof that are proximate fuse 220 as fuse 220 is programmed.

As conductive region 226 of fuse 220 is disposed adjacent the preferably n-type common well 214, a Schottky diode 215' (see FIG. 3A) is created at the interface between conductive region 226 and common well 214. While a forward-biased Schottky diode 215' tends to prevent current from flowing from common well 214 into conductive region 226 of fuse 220, if a sufficient voltage, such as the normal operating voltage of semiconductor device 210, is applied across Schottky diode 215', then Schottky diode 215' will become reverse-biased and, therefore, permit current to flow from common well 214 into conductive region 226 of fuse 220. When Schottky diode 215' is reverse-biased, however, current will not readily flow from conductive region 226 into common well 214.

Ohmic contact 229 preferably comprises semiconductive material of the same conductivity type as that of common well 214. The semiconductive material of ohmic contact 229 may include a higher concentration of dopant than the semiconductive material of common well 214.

A first contact 230 may be disposed in communication with conductive region 226 of fuse 220. First contact 230 preferably communicates with a current source. A second contact 232 may be disposed in communication with ohmic contact 229.

Figure 3A:
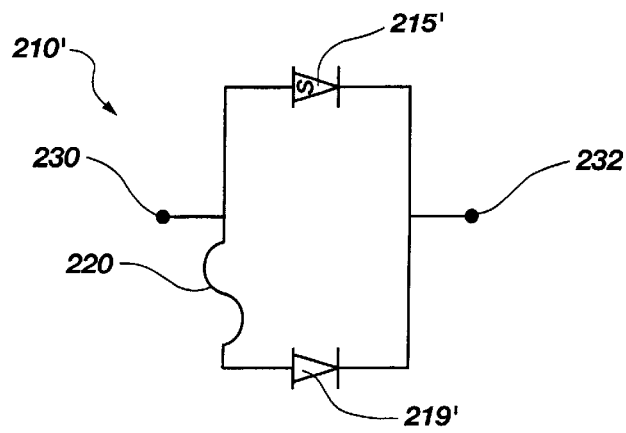
FIG. 3A is a schematic representation of a circuit including the semiconductor device and fuse of FIG. 3.

FIG. 3A schematically illustrates a circuit 210' of semiconductor device 210. While fuse 220 remains intact, as a current is applied to conductive region 226 through first contact 230, the current may be transmitted into common well 214 by means of either diode 219' or Schottky diode 215'. The current is then conducted through ohmic contact 229 and, thus, to second contact 232.

Figure 3B:
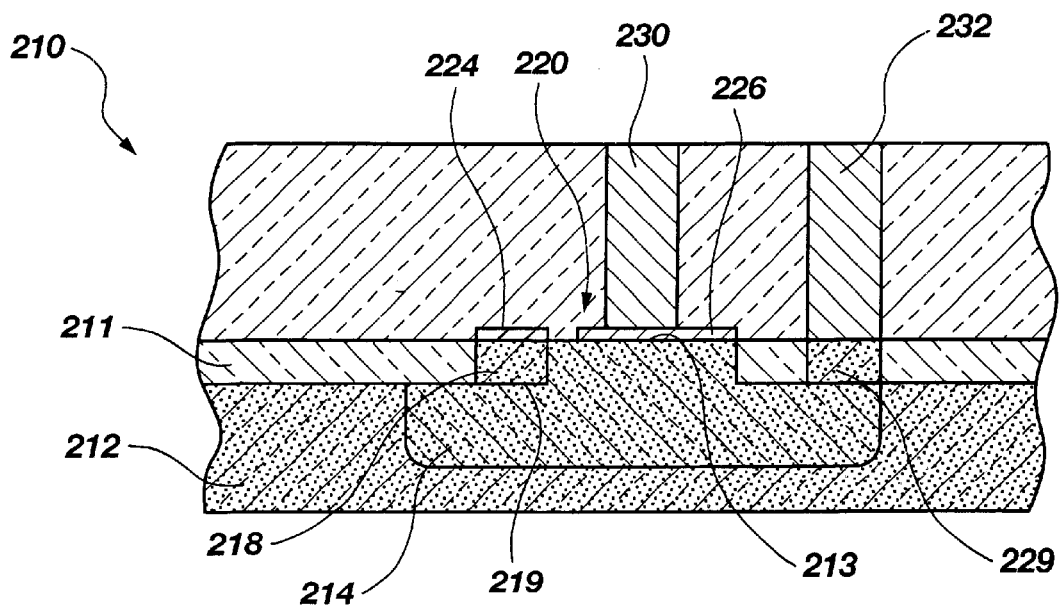
FIGS. 3B and 3C are schematic representations of the semiconductor device and circuit of FIGS. 3 and 3A, respectively, illustrating the semiconductor device and circuit including a "blown" fuse.
Figure 3C:
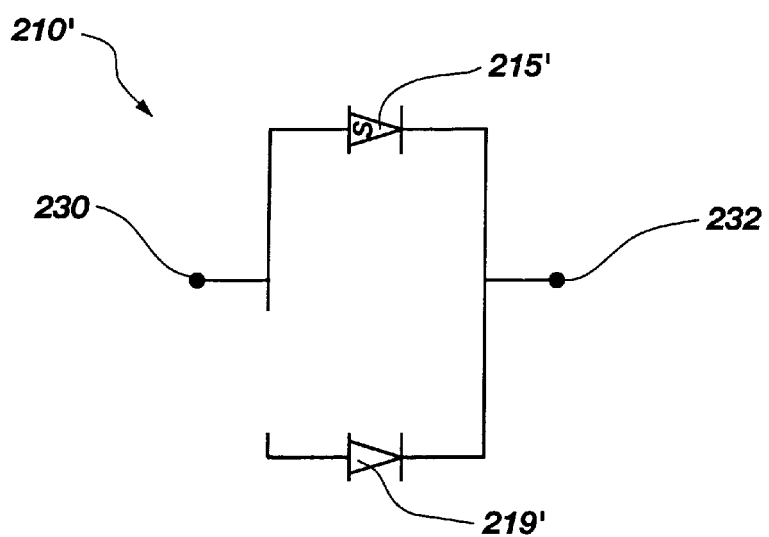

Turning now to FIGS. 3B and 3C, upon applying at least a programming current to fuse 220, narrowed region 228 thereof will preferably be rendered discontinuous. Accordingly, in order for current to be conducted to common well 214, the current must past through Schottky diode 215'. If, however, a sufficient voltage is applied across Schottky diode 215', such as occurs during the course of normal operation of semiconductor device 210, then Schottky diode 215' will become reverse-biased and, therefore, will no longer permit the flow of current from conductive region 226 into common well 214.

FIGS. 6–12 illustrate an exemplary method of fabricating conductivity doped wells and field isolation regions, such as field oxide regions or layers, on the semiconductor substrate illustrated in FIG. 2. The illustrated method includes the process flow typically employed for fabricating a basic CMOS inverter. Accordingly, portions of the fabrication process of the present invention may be conducted substantially simultaneously with corresponding steps of known CMOS inverter fabrication processes or with processes for fabricating other semiconductor device structures. It will be understood, however, by those skilled in the art, that other semiconductor fuses could be formed by slight modifications to the described method, such as by substituting dopants of an opposite polarity for those illustrated.

Figure 6:
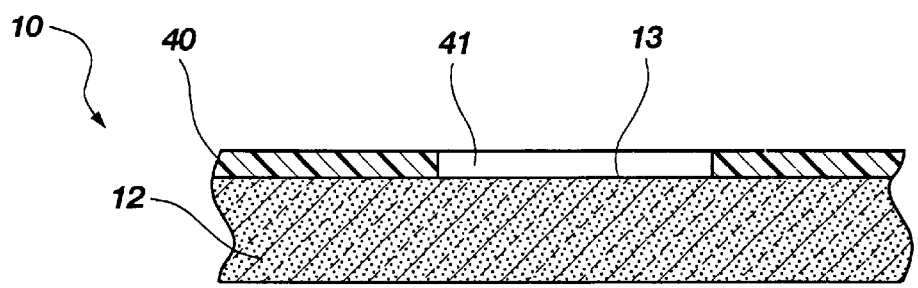
FIGS. 6–12 are cross-sectional representations of a semiconductor device, illustrating an embodiment of a method of forming conductively doped wells in the semiconductor substrate and of fabricating field isolation regions thereon.

As shown in FIG. 6, a semiconductor substrate 12 is first provided. Semiconductor substrate 12 may comprise any material and surface suitable for device formation, such as a semiconductor wafer (e.g., a silicon wafer), a SOI structure, a SOG structure, a SOC structure, or a SOS structure. Semiconductor substrate 12 may be doped and/or include an epitaxial layer. Preferably, semiconductor substrate 12 is a silicon wafer that has been lightly doped with a p-type dopant of a type known in the art and by known processes.

With continued reference to FIG. 6, a mask 40 may be disposed over an active surface 13 of semiconductor substrate 12. Mask 40 preferably includes apertures 41 therethrough, positioned to expose regions of semiconductor substrate 12 where the fabrication of common wells 14 (see FIG. 1) is desired. Mask 40 and the apertures 41 thereof may be fabricated by any known, suitable process. Preferably, mask 40 comprises a photomask and is, therefore, fabricated by disposing a quantity of photoresist onto surface 13 of semiconductor substrate 12, exposing and developing selected regions of the photoresist, and removing any undeveloped photoresist from semiconductor device 10.

Figure 7:
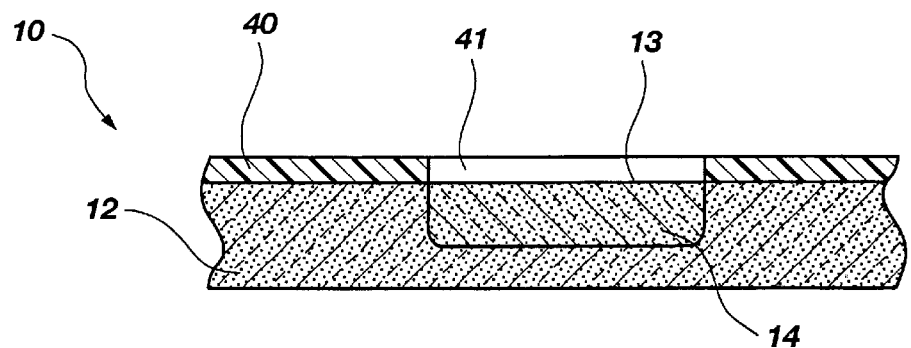

Referring to FIG. 7, a common well 14 of a first conductivity type may be formed adjacent surface 13 of semiconductor substrate 12 by any suitable process known in the art, such as by diffusion or implantation. Common well 14 may be formed in semiconductor substrate 12 by a blanket implant of a conductivity dopant, as known in the art. The conductivity dopant may be implanted into regions of semiconductor substrate 12 that are exposed through apertures 41 of mask 40 (see FIG. 6). Common well 14 is preferably lightly doped (i.e., implanted with a relatively low concentration of conductivity dopant). The dopant is preferably an n-type conductivity dopant. Accordingly, common well 14 preferably includes semiconductor material of an n-type conductivity and is, therefore, an n-well. Mask 40 may be removed by any suitable process known in the art.

Figure 8:
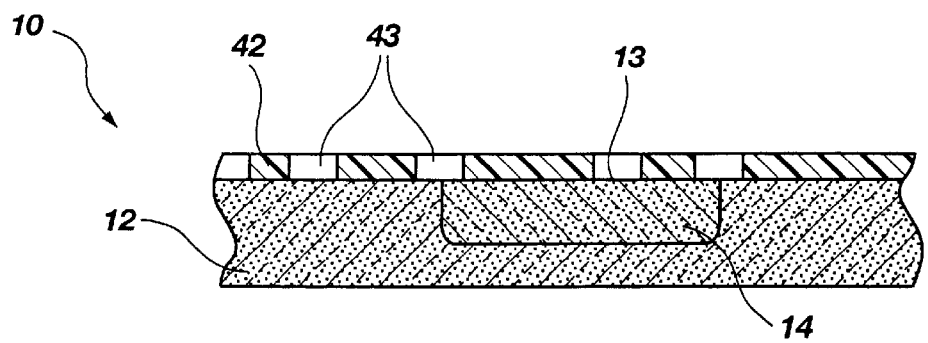
Figure 9:
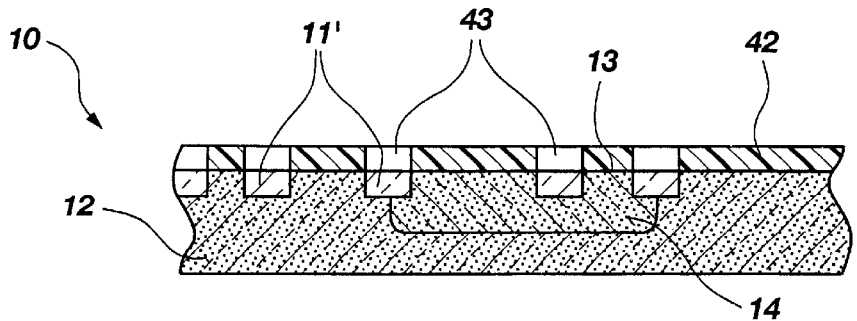
Figure 10:
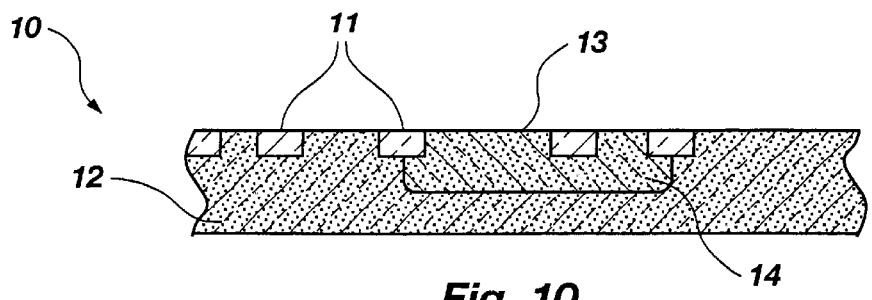

With reference to FIGS. 8–10, a process of fabricating field isolation regions, such as field oxide 11, is illustrated. As shown in FIG. 8, another mask 42, including apertures 43 therethrough, may be disposed adjacent surface 13 of semiconductor substrate 12. Any suitable process known in the art may be employed to dispose mask 42 onto semiconductor substrate 12. Preferably, mask 42 comprises a photomask and, therefore, may be disposed adjacent surface 13 by disposing a quantity of photoresist to adjacent surface 13, exposing and developing selected regions of the photoresist, and removing any undeveloped photoresist from surface 13. Alternatively, a so-called hard mask may be employed as mask 42. Preferably, apertures 43 of mask 42 are alignable over regions of semiconductor substrate 12 where the fabrication of a field isolation region, such as a field oxide 11 (see FIG. 10), is desired.

Referring now to FIG. 9, regions of semiconductor substrate 12 that are exposed through apertures 43 of mask 42 may be removed by known processes, such as by the use of an etchant of the material of semiconductor substrate 12, to define trenches 11' within semiconductor substrate 12.

Turning now to FIG. 10, an insulative material, such as a silicon oxide or a glass (e.g., borophosphosilicate glass ("BPSG"), phosphosilicate glass ("PSG"), or borosilicate glass ("BSG")), may be disposed within trenches 11'. Known processes may be employed to dispose insulative material within trenches 11', such as chemical vapor deposition of a silicon oxide or glass or by spin-on-glass ("SOG") processes. The insulative material within trenches 11' is planarized relative to surface 13 of semiconductor substrate 12 by known processes, such as by known chemical-mechanical planarization ("CMP") processes. Thus, trenches 11' and the insulative material therein comprise regions of field oxide 11 that do not protrude significantly above surface 13. This type of field oxide 11 region is typically referred to as a shallow trench isolation ("STI") field oxide.

Figure 11:
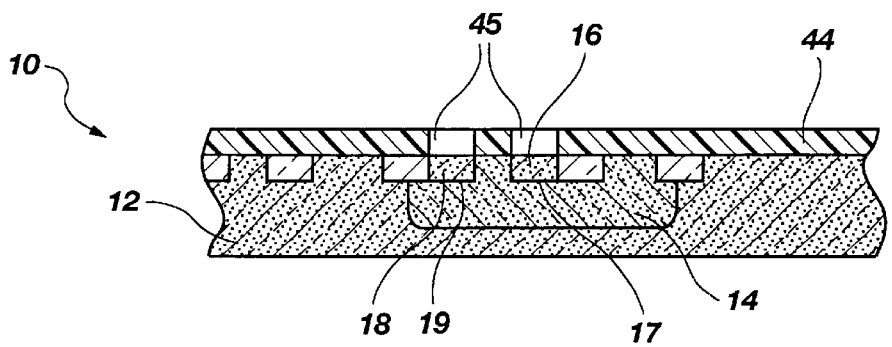

Referring now to FIG. 11, the fabrication of two spaced-apart wells 16 and 18, which are also referred to herein as second wells, adjacent or within common well 14, is illustrated. Wells 16 and 18 preferably comprise semiconductor material of a second conductivity type. Wells 16 and 18 may be formed by any suitable, known process, such as by disposing a mask 44 adjacent regions of semiconductor substrate 12 which are not to be doped to have the second type of conductivity. Regions of semiconductor substrate 12 that are to be doped to have the second conductivity type are exposed through apertures 45 of mask 44. Preferably, mask 44 comprises a photomask, which may be fabricated by disposing a photoresist over semiconductor substrate 12, exposing and developing selected regions of the photoresist, and removing any undeveloped photoresist from regions of semiconductor substrate 12 that are to be doped. These regions of semiconductor substrate 12 that are exposed through apertures 45 may be doped by known processes to form wells 16 and 18. Preferably, wells 16 and 18 are heavily doped, relative to the doping concentration of common well 14 (i.e., the dopant concentrations of wells 16 and 18 exceeds the dopant concentration of common well 14), with a p-type dopant. Thus, wells 16 and 18 have a conductivity type opposite the conductivity type of common well 14. Mask 44 may then be removed by any suitable process known in the art.

Due to the opposite conductivity type of common well 14 from the conductivity type of wells 16 and 18, diodes 17', 19' (see, e.g. FIG. 1B) are created at the p-n junctions 17, 19 between well 16 and common well 14 and between well 18 and common well 14, respectively. The concentrations and types of doping of wells 16 and 18 and of common well 14 preferably impart diodes 17' and 19' with the desired conductivity characteristecs, such as the direction in which diodes, when forward-biased, conduct current. The concentrations and types of doping of wells 16 and 18 and of common well 14 also dictate, at least in part, the voltage or voltages at which diodes 17' and 19' will become reverse-biased.

Figure 12:
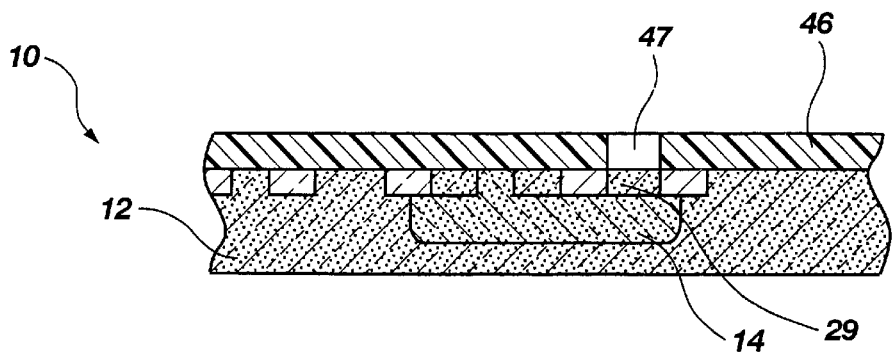

As illustrated in FIG. 12, yet another mask 46, including apertures 47 therethrough, may be disposed over semiconductor substrate 12. Apertures 47 preferably expose regions of semiconductor substrate 12 that are to be more heavily doped with a dopant of a first conductivity type than the concentration of dopant with which common well 14 was doped. Again, mask 46 and the apertures 47 therethrough may be defined by known processes and, preferably, are disposed and defined by known photomask processes. The regions of semiconductor substrate 12 that are exposed through apertures 47 may be doped with a dopant of a first conductivity type and preferably with an n-type conductivity dopant, by known processes. At least one of these regions of semiconductor substrate 12, which is disposed adjacent or otherwise in communication with common well 14, may be employed as an ohmic contact 29. Mask 46 may be removed by any suitable process known in the art.

Referring now to FIGS. 13–18, another embodiment of a method of fabricating conductivity doped wells and field isolation regions, such as field oxides, on a semiconductor substrate is illustrated.

Figure 13:
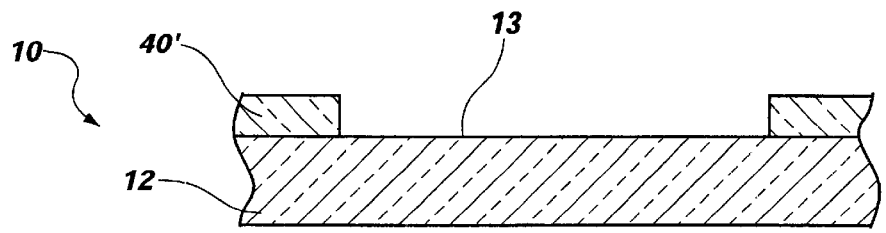
FIGS. 13–18 are cross-sectional representations of a semiconductor device, illustrating an alternative embodiment of the method of forming conductively doped wells in the semiconductor substrate and of fabricating field isolation regions thereon.

With reference to FIG. 13, a pad oxide layer 40', which acts as a mask and as a stress relief layer, may be formed over an active surface 13 of semiconductor substrate 12 by any suitable process known in the art. Pad oxide layer 40' may be thermally grown on semiconductor substrate 12 or deposited onto semiconductor substrate 12 by known processes, such as chemical vapor deposition ("CVD") of tetraethylorthosilicate ("TEOS"), or otherwise formed on semiconductor substrate 12 by known techniques. Layer 40' may then be patterned by known processes, such as by disposing a mask (e.g., a photomask) over layer 40' and removing material of layer 40' through apertures of the mask (e.g., by etching). Pad oxide layer 40' preferably comprises silicon oxide formed by thermal oxidation of a silicon semiconductor substrate 12.

Figure 14:
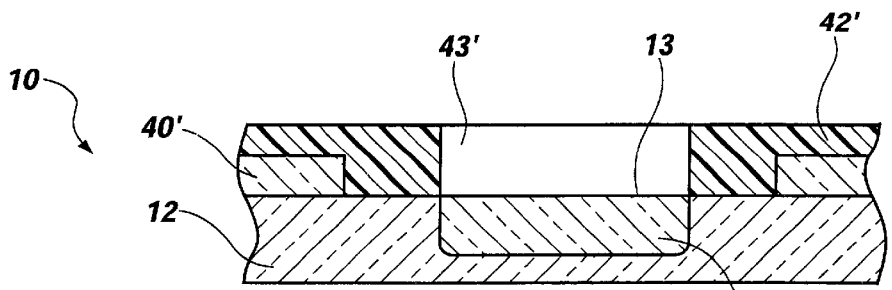

With reference to FIG. 14, a common well 14' of a first conductivity type may be formed adjacent surface 13 of semiconductor substrate 12 by any suitable process known in the art, such as by diffusion or implantation. Preferably, a mask 42', such as a photomask, including apertures 43' therethrough, is disposed over at least the exposed regions of semiconductor substrate 12 that are to be shielded from the conductivity dopant. If a photomask is employed as mask 42', photoresist may be disposed on semiconductor substrate 12, selected regions of the photoresist exposed and developed to define mask 42' and apertures 43' therethrough, and any undeveloped photoresist removed from mask 42' in order to form the same. Alternatively, a so-called hard mask may be employed as mask 42'.

Common well 14' may be formed in semiconductor substrate 12 by a blanket implant of a conductivity dopant, as known in the art. The conductivity dopant may be implanted into regions of semiconductor substrate 12 that are exposed through apertures 43' of mask 42'. Common well 14' is preferably lightly doped (i.e., implanted with a relatively low concentration of conductivity dopant). The dopant is preferably an n-type conductivity dopant. Accordingly, common well 14' preferably includes semiconductive material of an n-type conductivity and is, therefore, an n-well. Mask 42' may be removed from semiconductor device 10 by any suitable process known in the art.

Figure 15:
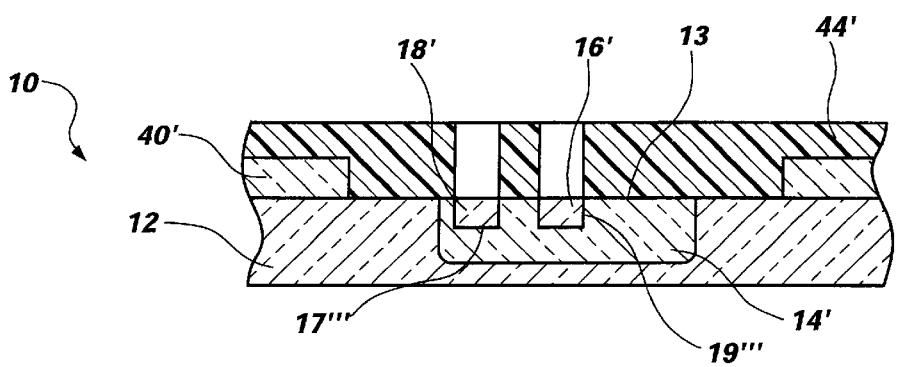

FIG. 15 illustrates the fabrication of two wells 16' and 18' of semiconductor material of a second conductivity type, which are also referred to herein as second wells or as at least two spaced-apart wells. Wells 16' and 18' are formed adjacent surface 13 of semiconductor substrate 12 and within or adjacent common well 14'. Wells 16' and 18' may be formed by any suitable process known in the art, such as by disposing a mask 44' over the regions of semiconductor substrate 12 which are not to be doped to have the second conductivity type. Preferably, mask 44' is formed by disposing a photoresist over semiconductor substrate 12, exposing and developing selected regions of the photoresist, and removing undeveloped photoresist. Thus, mask 44' may comprise a photomask. Upon disposal of mask 44' on semiconductor substrate 12, regions of semiconductor substrate 12 that are exposed through mask 44' and through pad oxide layer 40' may be doped by any suitable doping process, such as by diffusion or implantation, to impart these regions with a second conductivity type and, thereby, to form wells 16' and 18'. Preferably, wells 16' and 18' are heavily doped, relative to the dopant concentration of common well 14', with a p-type dopant. Thus, wells 16' and 18' have a conductivity type opposite the conductivity type of common well 14'. Mask 44' may be removed by any suitable process known in the art.

Due to the opposite conductivity type of common well 14' from the conductivity type of wells 16' and 18', diodes are created at the p-n junctions 17', 19' between well 16' and common well 14' and between well 18' and common well 14', respectively. The concentrations and types of doping of wells 16' and 18' and of common well 14' preferably impart the diodes with the desired conductivity characteristics, such as the direction in which the diodes, when forward-biased, conduct current. The concentrations and types of doping of wells 16' and 18' and of common well 14' also dictate, at least in part, the voltage or voltages at which the diodes will become reverse-biased.

An ohmic contact 29' (see FIG. 16) may also be formed adjacent common well 14' by known processes, such as by the method disclosed herein in reference to FIG. 12.

Figure 16:
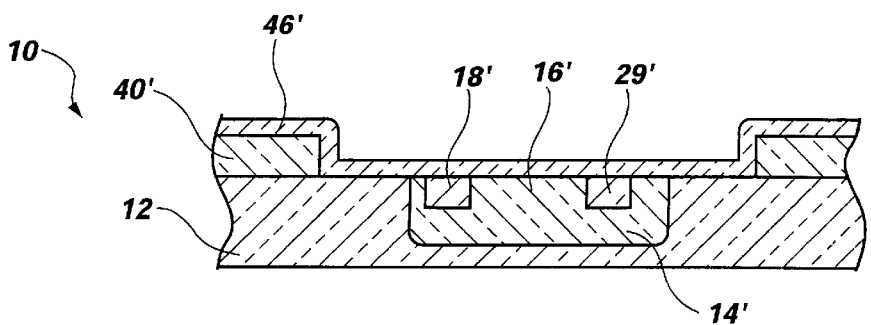

As depicted in FIG. 16, a layer 46' of silicon nitride or another masking material, such as a photomask, may be disposed over semiconductor substrate 12 and pad oxide layer 40'. If layer 46' comprises silicon nitride, any suitable process known in the art, such as a CVD process, can be employed to deposit layer 46'. As explained below, layer 46' may serve as a mask during the fabrication of field isolation regions, such as field oxide 11'.

Figure 17:
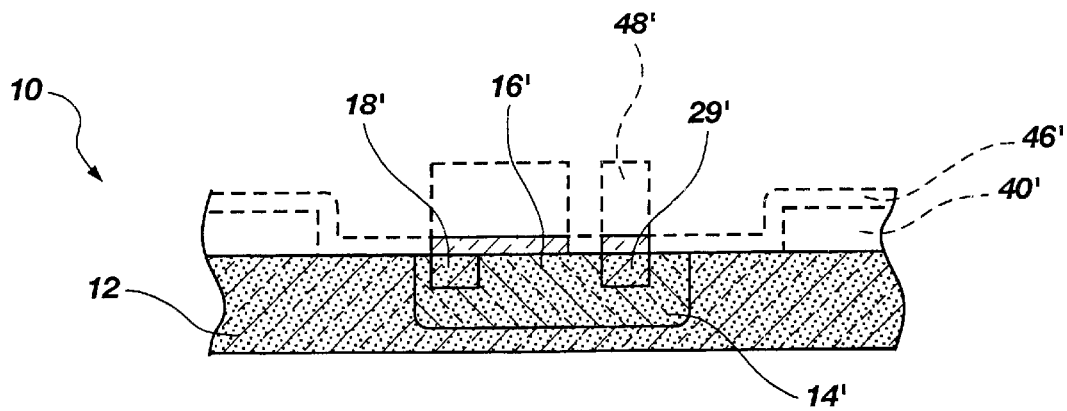

As shown in FIG. 17, regions of layer 46' and pad oxide layer 40' that overlie the areas of semiconductor substrate 12 upon which the fabrication of field isolation regions, such as field oxide 11' (see FIG. 18), is desired, may be removed. Any suitable patterning process known in the art, such as the disposal of a mask 48' (e.g., a photomask) and the use of known etchants and etch processes, may be employed to remove these regions of layer 46' and pad oxide layer 40' and to, thereby, expose the regions of semiconductor substrate 12 upon which fabrication of field isolation regions is desired. For example, a quantity of photoresist can be spun onto an active surface of semiconductor device 10, exposed, developed, and portions thereof removed to form mask 48'. Selected regions of layer 46' and of pad oxide layer 40' may be removed through mask 48' by a known suitable etching process or processes. Mask 48' may be removed by any suitable process known in the art which does not attack the remaining regions of layer 46', pad oxide layer 40', or semiconductor substrate 12.

Figure 18:
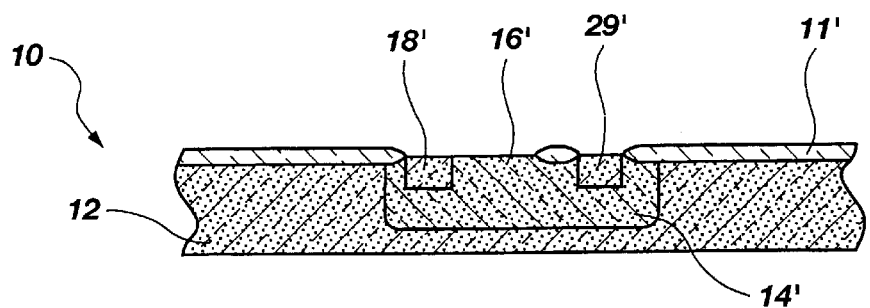

Referring to FIG. 18, the field isolation regions, such as field oxide 11', may be formed on semiconductor substrate 12. The field isolation regions are preferably somewhat recessed insulative regions of semiconductor substrate 12, such as oxide regions, which may be formed by any suitable, known process. Preferably, the regions of semiconductor substrate 12 that are exposed through the remaining portions of layer 46' or pad oxide layer 40' (see FIG. 17) are oxidized by known oxidation processes, such as by thermal oxidation techniques. Accordingly, layer 46' and pad oxide layer 40' are employed as a mask during the fabrication of the field isolation regions. After the field isolation regions have been fabricated, layer 46' and pad oxide layer 40' may be removed by any suitable process known in the art which does not substantially attack or remove semiconductor substrate 12 or the field isolation regions. For example, layer 46' and pad oxide layer 40' may be removed by a wet etch process using hydrogen fluoride and/or phosphoric acid.

Once the conductively doped wells 14, 16, and 18 or 14', 16', and 18' and the field oxide 11 or 11' regions have been formed or fabricated on semiconductor substrate 12, a metal silicide fuse 20 according to the present invention may be fabricated. Although FIGS. 19, 19A and 20 illustrate the fabrication of fuse 20 on the semiconductor substrate of FIG. 12, the fuse of the present invention may be fabricated upon or adjacent semiconductor devices having different configurations or fabricated by different processes.

Figure 19:
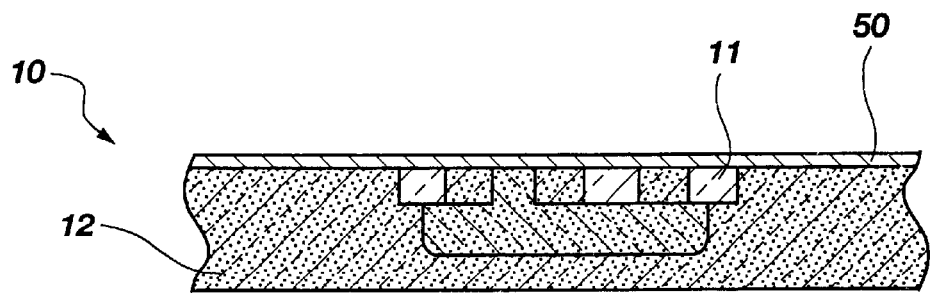
FIGS. 19, 19A and 20 are cross-sectional representations of a semiconductor device, illustrating an embodiment of a method of fabricating the metal silicide fuse.
Figure 20:
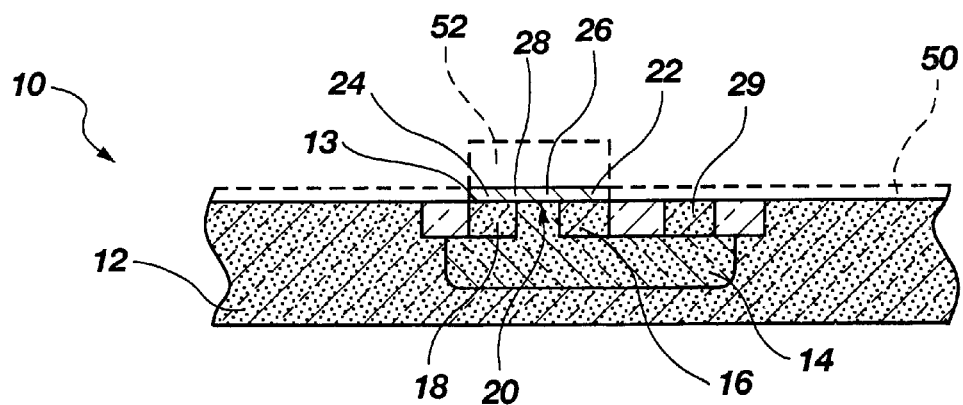
Figure 13:
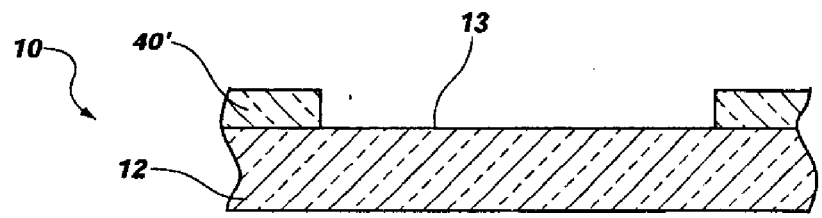
Figure 14:
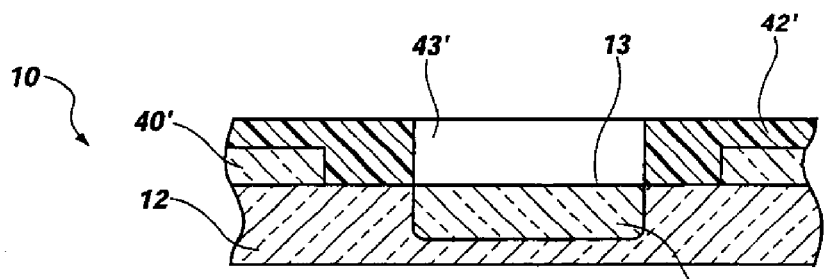
Figure 15:
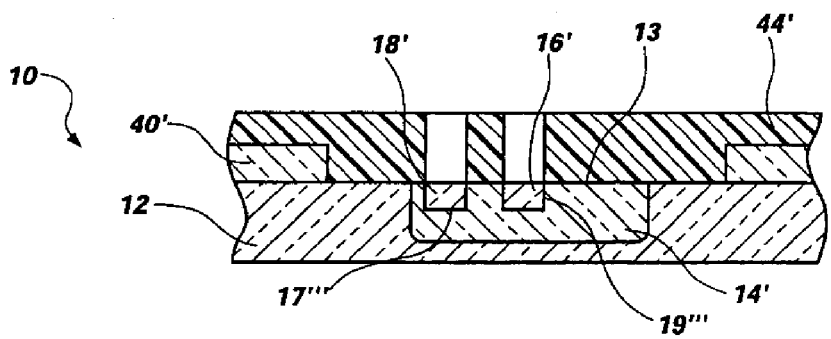
Figure 16:
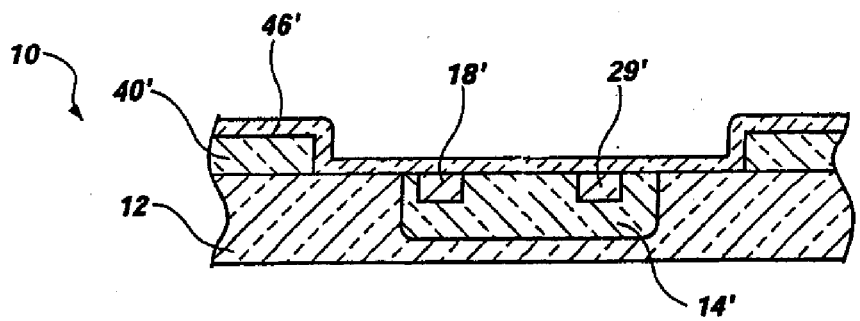
Figure 17:
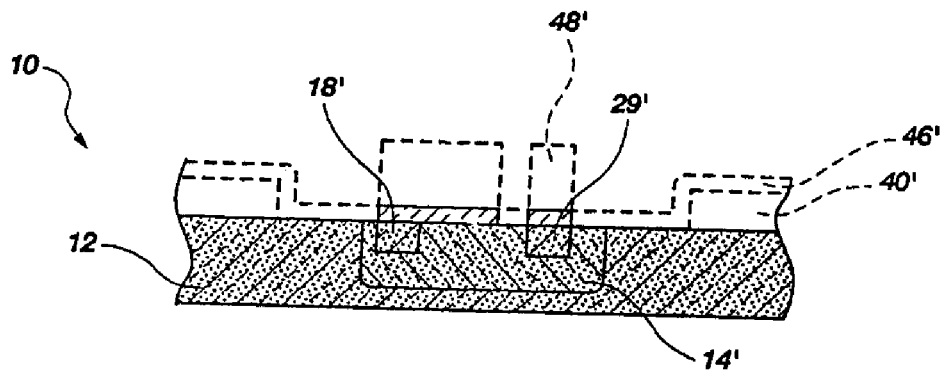
Figure 18:
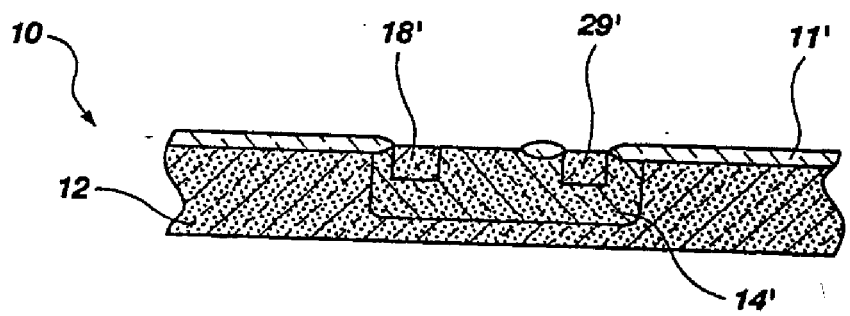

With reference to FIG. 19, a layer 50 of metal silicide is disposed at least over semiconductor substrate 12. Layer 50 may also be disposed over field oxide 11. Layer 50 may be disposed by any suitable, known process, such as by chemical vapor depositing the metal silicide onto semiconductor device 10.

An exemplary tungsten silicide deposition process that may be employed in the method of the present invention is disclosed in U.S. Pat. No. 5,231,056, which issued to Gurtej S. Sandhu on Jul. 27, 1993, the disclosure of which is hereby incorporated herein in its entirety by this reference. If titanium silicide is employed as the metal silicide of layer 50, known titanium silicide deposition processes, such as those disclosed in U.S. Pat. Nos. 5,240,739, 5,278,100, and 5,376,405, each of which issued to Trung T. Doan et al. on Aug. 31, 1993, Jan. 11, 1994, and Dec. 27, 1994, respectively, the disclosures of each of which are hereby incorporated herein by reference in their entireties, may be used.

Figure 19A:
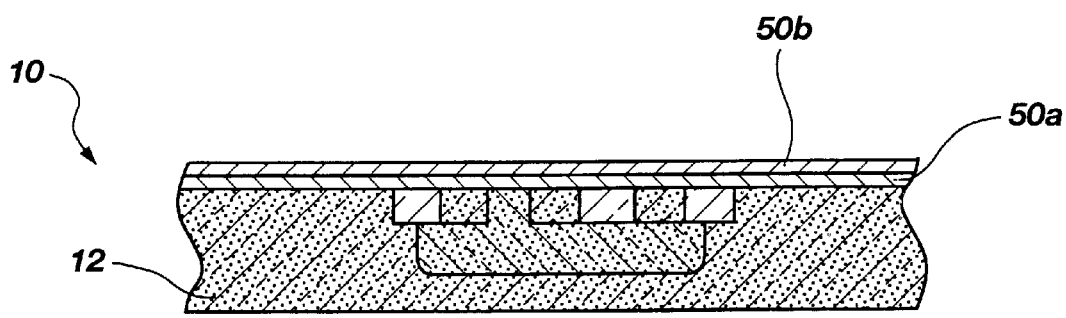

Alternatively, as shown in FIG. 19A, adjacent layers 50a and 50b, which comprise metal and silicon, respectively, may be disposed over a surface of semiconductor device 10 and annealed to form layer 50 of metal silicide (see FIG. 11). Layer 50a of metal, which may comprise any metal, such as titanium, tantalum, tungsten, molybdenum, cobalt, lead, nickel, or platinum, that will react with silicon to form a metal silicide and which preferably comprises a refractory metal, may be disposed on semiconductor device 10 by known processes, such as by chemical vapor deposition or physical vapor deposition ("PVD") (e.g., sputtering processes), depending, at least in part, upon the type of metal employed. Layer 50b, which comprises silicon or polysilicon, may be disposed on semiconductor device 10 by known processes, such as by chemical vapor deposition. Although a layer 50b of silicon is shown to be disposed over layer 50a of metal, layer 50b may be disposed under layer 50a. Alternatively, layer 50a may be annealed to an upper portion of the adjacent semiconductor substrate 12, in which case it would not be necessary to dispose layer 50b comprising silicon adjacent layer 50a. When layer 50 comprises titanium or a titanium alloy, the annealing temperature may range from about 500° C. to about 800° C. and the duration of time that layer 50a and the adjacent silicon or polysilicon are exposed to the annealing temperature may range from about 20 seconds to about 200 minutes.

As depicted in FIG. 20, layer 50 may be patterned by any suitable process known in the art to define fuse 20. While patterning layer 50 to define fuse 20 therefrom, regions of layer 50 that overlie wells 16 and 18 are preferably configured as terminal regions 22 and 24. The region of layer 50 disposed between terminal regions 22 and 24, which region is disposed directly adjacent the portion of common well 14 exposed to surface 13 between wells 16 and 18, is configured as central region 26, which is also referred to herein as the conductive region, of fuse 20. Central region 26 is preferably narrower in width or has a smaller material volume than terminal regions 22 and 24. A narrowed, or necked-down, region 28 of fuse 20, disposed between central region 26 and terminal region 24, preferably has an even narrower width and smaller material volume than central region 26.

Known processes, such as the disposal of a mask 52 over layer 50 and the removal of portions of layer 50 that are exposed through mask 52, may be employed to pattern layer 50. For example, mask 52 can be disposed adjacent layer 50 by disposing a quantity of a photoresist material adjacent layer 50 (e.g., by spin-on processes) and by exposing and developing selected regions of the photoresist material. The portions of layer 50 that are exposed through mask 52 may be removed by any suitable etching process and with any suitable etchant of the material or materials of layer 50 to define fuse 20. Preferably, if removal of any structures or layers that underlie layer 50 is not desired, the etching process and etchant will not substantially remove the material or materials of these structures or layers. Anisotropic etchants and etching processes are preferably employed to pattern layer 50. If layer 50 is formed by annealing a layer 50a (see FIG. 19A) of metal to an adjacent silicon or polysilicon structure or layer, the metal layer (and an adjacent silicon or polysilicon layer, if any) may be patterned prior to annealing or layer 50 of metal silicide may be patterned after layer 50a of metal has been annealed to the adjacent silicon or polysilicon.

Although the foregoing description contains many specifics and examples, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method for fabricating a fuse of a semiconductor device, comprising:

doping a first region of a semiconductor substrate to have a first conductivity type;

doping at least two spaced apart second regions of said semiconductor substrate adjacent said first region to have a second conductivity type;

disposing a layer comprising metal silicide adjacent said semiconductor substrate, including said first region and said at least two spaced apart second regions; and patterning said layer to define at least two terminal regions of the fuse, each of said at least two terminal regions disposed adjacent a corresponding one of said at least two spaced apart second regions, a conductive region of the fuse disposed between said at least two terminal regions, and a narrowed region of the fuse disposed between said conductive region and one of said at least two terminal regions and positioned adjacent a boundary between one of said at least two spaced apart second regions and said first region.

2. The method of claim 1, wherein said doping said first region comprises doping said first region to have an n-type conductivity.

3. The method of claim 1, wherein said doping said at least two spaced apart second regions comprises doping said at least two spaced apart second regions to have a p-type conductivity.

4. The method of claim 1, wherein said disposing said layer comprising metal silicide comprises chemical vapor depositing said layer.

5. The method of claim 1, wherein said disposing said layer comprising metal silicide comprises disposing a layer comprising metal adjacent at least said semiconductor substrate and annealing said metal to silicon or polysilicon adjacent said layer.

6. The method of claim 5, further comprising disposing a layer comprising silicon or polysilicon adjacent said layer comprising metal.

7. The method of claim 6, further comprising annealing said metal to at least said silicon or polysilicon of the adjacent layer.

8. The method of claim 1, wherein said patterning comprises disposing a mask over said layer comprising metal silicide and removing selected regions of said layer comprising metal silicide through said mask.

9. The method of claim 8, wherein said disposing said mask comprises:

disposing photoresist on the semiconductor device;

exposing selected regions of said photoresist; and developing said selected regions.

10. The method of claim 8, wherein said removing comprises etching said selected regions of said layer comprising metal silicide.

11. The method of claim 5, wherein said patterning comprises disposing a mask over said layer comprising metal and removing selected regions of said layer through said mask.

12. The method of claim 11, wherein said disposing said mask comprises:

disposing photoresist on the semiconductor device;

exposing selected regions of said photoresist; and developing said selected regions.

13. The method of claim 11, wherein said removing comprises etching said selected regions.

14. The method of claim 1, further comprising disposing a contact in communication with each of said at least two terminal regions.

15. A method for fabricating a semiconductor device structure, comprising:

providing a semiconductor substrate including at least a first well of a first conductivity type adjacent a surface thereof and a second well of a second conductivity type adjacent said first well and said surface;

disposing a layer comprising metal silicide adjacent said surface; and patterning said layer to include a first region adjacent said surface, a narrowed region adjacent a boundary between said first well and said second well, and a second region adjacent said second well.

16. The method of claim 15, wherein said disposing said layer comprises chemical vapor depositing metal silicide onto said semiconductor substrate.

17. The method of claim 15, wherein said disposing said layer comprises disposing a layer comprising metal over said semiconductor substrate and annealing said metal to adjacent silicon or polysilicon.

18. The method of claim 17, wherein said disposing said layer comprising metal comprises physical vapor depositing or chemical vapor depositing said metal.

19. The method of claim 17, further comprising disposing a layer comprising silicon or polysilicon adjacent said layer comprising metal.

20. The method of claim 19, wherein said disposing said layer comprising silicon or polysilicon comprises chemical vapor depositing said silicon or polysilicon.

21. The method of claim 19, wherein said disposing said layer comprising silicon or polysilicon comprises disposing said layer comprising silicon or polysilicon between said semiconductor substrate and said layer comprising metal.

22. The method of claim 19, wherein said disposing said layer comprising silicon or polysilicon comprises disposing said layer comprising silicon or polysilicon on said layer comprising metal.

23. The method of claim 19, wherein said annealing comprises annealing metal of said layer to adjacent silicon or polysilicon of said layer comprising silicon or polysilicon.

24. The method of claim 17, wherein said annealing comprises increasing a temperature of at least said layer comprising metal.

25. The method of claim 17, wherein said annealing comprises annealing metal of said layer to adjacent silicon or polysilicon of said semiconductor substrate.

26. The method of claim 15, wherein said patterning comprises disposing a mask over said layer comprising metal silicide and removing selected regions of said layer comprising metal silicide through said mask.

27. The method of claim 26, wherein said disposing said mask comprises:

disposing photoresist adjacent said layer of metal silicide;

exposing selected regions of said photoresist; and developing said selected regions.

28. The method of claim 26, wherein said removing comprises etching said selected regions.

29. The method of claim 17, wherein said patterning comprises disposing a mask over said layer comprising metal and removing selected regions of said layer through said mask.

30. The method of claim 29, wherein said disposing said mask comprises:

disposing photoresist on the semiconductor device structure.

31. The method of claim 29, wherein said removing comprises etching said selected regions.

32. The method of claim 15, further comprising disposing a contact in communication with said first region.

33. The method of claim 32, further comprising disposing a second contact in communication with said first well.

* * * * *

UNITED STATES PATENT AND TRADEMARK OFFICE
CERTIFICATE OF CORRECTION

PATENT NO. : 6,410,367 B2
DATED : June 25, 2002
INVENTOR(S) : Kenneth W. Marr and Michael P. Violette It is certified that error appears in the above-identified patent and that said Letters Patent is hereby corrected as shown below:

Title page,
Item [57], ABSTRACT,
Line 9, before "diodes" insert -- diode or --

Drawings,
Delete sheet 8 of 10, and replace with sheet 8 of 10. (Attached)
Delete sheet 9 of 10, and replace with sheet 9 of 10. (Attached)

Column 5,
Line 34, change "regions" to -- region --

Column 12,
Line 55, change "characteristecs" to -- characteristics --

Column 14,
Line 17, change "17', 19'''" to -- 17''', 19''' --

Signed and Sealed this

Twenty-second Day of February, 2005

JON W. DUDAS
*Director of the United States Patent and Trademark Office*